United States Patent
Pradier et al.

(10) Patent No.: US 10,263,431 B2
(45) Date of Patent: Apr. 16, 2019

(54) SUPPLY SYSTEM FOR ELECTRONIC BOARDS OF AN ELECTRICAL DISTRIBUTION SYSTEM

(71) Applicant: Zodiac Aero Electric, Montreuil (FR)

(72) Inventors: Jean-Clair Pradier, Houilles (FR); Jean-Pierre Balbinot, Le Kremlin-Bicetre (FR)

(73) Assignee: ZODIAC AERO ELECTRIC, Montreuil (FR)

( * ) Notice: Subject to any disclaimer, the term of this patent is extended or adjusted under 35 U.S.C. 154(b) by 410 days.

(21) Appl. No.: 14/827,065

(22) Filed: Aug. 14, 2015

(65) Prior Publication Data

US 2016/0049795 A1 Feb. 18, 2016

(30) Foreign Application Priority Data

Aug. 14, 2014 (FR) ...................... 14 57845

(51) Int. Cl.
*H02J 9/00* (2006.01)
*H02J 4/00* (2006.01)
(Continued)

(52) U.S. Cl.
CPC ........ *H02J 5/00* (2013.01); *H02J 1/12* (2013.01); *H02M 3/04* (2013.01); *H05K 7/1457* (2013.01)

(58) Field of Classification Search
CPC .... H02J 5/00; H02J 1/12; H02M 3/04; H05K 7/1457
(Continued)

(56) References Cited

U.S. PATENT DOCUMENTS 6,614,133 B2 * 9/2003 Belson ............... H02J 1/10
307/29
8,067,857 B2 * 11/2011 Humphrey ............ G06F 1/263
307/82
(Continued)

FOREIGN PATENT DOCUMENTS

CN 101340185 A 1/2009
CN 103158641 A 6/2013
(Continued)

OTHER PUBLICATIONS

United Kingdom Search Report, dated Feb. 18, 2016, issued in corresponding Application No. GB1514126.0, filed Aug. 14, 2015, 1 page.
(Continued)

*Primary Examiner* — Brandon S Cole
(74) *Attorney, Agent, or Firm* — Christensen O'Connor Johnson Kindness PLLC

(57) ABSTRACT

Supply system for electronic boards of an electrical distribution system comprising at least two protection boards (2a, 2b) each able to control the supply of at least one protected pathway (3a, 3b) on the basis of a power line (4a, 4b), characterized by the fact that each protection board (2a, 2b) comprises at least one voltage converter (13a, 13b) able to provide an internal supply voltage of the protection board on the basis of a supply voltage, the voltage converter (13a) of a first protection board (2a) being connected to at least one second protection board (2b) so as to be able to provide the internal supply of the second protection board (2b) in case of failure of the voltage converter (13b) of the second protection board (2b).

7 Claims, 8 Drawing Sheets

(51) Int. Cl.
    *H02H 7/00* (2006.01)
    *G01R 31/36* (2006.01)
    *H02J 1/00* (2006.01)
    *G06F 1/10* (2006.01)
    *H02J 3/36* (2006.01)
    *H02J 5/00* (2016.01)
    *H02J 1/12* (2006.01)
    *H02M 3/04* (2006.01)
    *H05K 7/14* (2006.01)

(58) Field of Classification Search
    USPC .................................................. 307/11–42
    See application file for complete search history.

(56) References Cited

U.S. PATENT DOCUMENTS

| | | | | |
|---|---|---|---|---|
| 9,413,162 | B2* | 8/2016 | Brouwer | H02H 7/00 |
| 2005/0185352 | A1* | 8/2005 | Nguyen | H02J 1/10 |
| | | | | 361/90 |
| 2008/0191552 | A1* | 8/2008 | Suzuki | G06F 1/263 |
| | | | | 307/23 |
| 2011/0140535 | A1* | 6/2011 | Choi | H02J 3/32 |
| | | | | 307/82 |
| 2011/0191601 | A1* | 8/2011 | Tsuyuki | G06F 11/2015 |
| | | | | 713/300 |
| 2012/0232728 | A1* | 9/2012 | Karimi | H02J 3/38 |
| | | | | 701/22 |

FOREIGN PATENT DOCUMENTS

| | | |
|---|---|---|
| CN | 203084594 U | 7/2013 |
| WO | 97/18612 A1 | 5/1997 |

OTHER PUBLICATIONS

Notification of First Office Action, dated Oct. 18, 2018 in corresponding Chinese Application No. 201510502933.5, filed Aug. 14, 2015, 11 pages. Included English translation.

* cited by examiner

SUPPLY SYSTEM FOR ELECTRONIC BOARDS OF AN ELECTRICAL DISTRIBUTION SYSTEM

The invention lies within the technical field of the electrical power supplies of electronic boards, and more particularly such electrical power supplies of electronic boards in an electrical distribution system.

An aircraft generally possesses an electrical system comprising in particular a primary distribution system for distributing electrical energy and a secondary distribution system. This secondary distribution system makes it possible to protect and to distribute the electrical power originating from internal sources, for example generators or batteries, or from external sources, such as ground power facilities.

The secondary distribution system is composed of several electronic boards: computation and communication boards (EDMU) and protection boards (SSPC). Certain configurations sometimes comprise specific supply boards.

The internal electronic functions of the boards are generally supplied through dedicated 28V lines, either directly on the basis of a source taken from the primary core, or via a supply board internal to the secondary distribution system.

FIG. 1 illustrates the supply system for a rack 1 equipped with protection boards, referenced 2a, 2b and 2c, ensuring the protection of three sets of SSPC pathways termed protected pathways, referenced 3a, 3b and 3c. The EDMU boards intended for the logic control of the protection boards are not represented, for the sake of clarity.

Each protection board 2a, 2b and 2c comprises two supply inputs, a first input 4a, 4b and 4c connected to a power line intended to be distributed by the protection board to the various loads connected by way of at least one protected pathway and a second input 5a, 5b and 5c connected to an auxiliary supply line intended for the internal supply of the protection board and of the protected pathway. The input intended for the internal supply is optionally made redundant (two inputs) for availability reasons. Internal buses are linked by inputs 6a, 6b, 6c, 7a, 7b and 7c to the protection boards.

Each protection board comprises a single DC/DC converter (8a, 8b and 8c transforming the voltage received on the second input 5a, 5b and 5c into voltages (typically 12V, 3V3, etc.) that are usable by the internal electronic functions of the protection board, in particular the supply of the microprocessors 9a, 9b and 9c, the generation of the control signals for the transistors 10a, 10b and 10c controlling the protected pathways and the measurements of current and of voltage.

Given that the other elements of the protection board are either made redundant, or dedicated to a protected pathway, this DC/DC converter becomes de facto the common point shared by all the functions of the protection board and of the protected pathway. In case of fault of the DC/DC converter, all the functions of the protection board and of the protected pathway of the board are lost.

Moreover, segregation is generally effected between the power supply and the internal supply of the SSPC, so as to prevent a simple fault on the power supply from propagating to the electronics of the SSPC.

In another exemplary embodiment, illustrated by FIG. 2, the internal supply is provided by a supply board 11. The supply board 11 comprises a DC/DC converter, bearing the reference 11a, which provides a regulated and protected voltage, thereby making it possible to simplify the design of the DC/DC converters 8a, 8b and 8c of the protection boards.

This voltage can also be made redundant if the safety demands so require. The redundancy can be extended to the DC/DC converter 11a of the supply board 11. Such an example is illustrated by FIG. 3, in which the supply board 11 comprises two DC/DC converters 11a and 11b supplying two regulated-voltage rails, each rail supplying in a redundant manner each DC/DC converter 8a, 8b and 8c of each protection board.

Finally, the redundancy can be extended to the DC/DC internal converters 8a, 8b and 8c of the protection boards, thereby eliminating the common point represented by this function in FIGS. 1 to 3. Such an example is illustrated by FIG. 4 in which each protection board 2a, 2b and 2c comprises two DC/DC converters respectively 8a and 11a, 8b and 11b and 8c and 11c, each DC/DC converter being supplied by a different DC/DC converter 11a and 11b of the supply board 11. The two DC/DC converters of each protection board providing the internal supply voltage of the protection board.

Such structures present the advantage of separation between power functions and logic functions as well as of availability and SSPC cost varying according to the scheme adopted. However, they also exhibit the drawback of requiring a dedicated supply board, involving an additional reference and an additional mass in the rack of boards, as well as additional development, manufacturing and maintenance costs. These additional costs also apply to the twinning of the lines for the external supply and to the twin rail for the internal supply, for each rack of protection boards.

A need exists for a supply system for electronic boards not requiring any supply boards and providing the highest availability level with the lowest cost.

The subject of the invention is a supply system for electronic boards comprising at least two protection boards each able to control the supply of at least one protected pathway on the basis of a power line. Each protection board comprises at least one voltage converter able to provide an internal supply voltage of the protection board on the basis of a supply voltage, the voltage converter of a first protection board being connected to at least one second protection board so as to be able to provide the internal supply of the second protection board in case of failure of the voltage converter of the second protection board.

The voltage converter may be able to be supplied by the power line and by an auxiliary supply line exhibiting different voltages.

The system may comprise a passive means of supply selection able to provide the internal supply of a first protection board with the voltage provided by the voltage converter of a second protection board when the voltage provided by the voltage converter of the first protection board is absent. The passive means of supply selection comprises a first input connected to the voltage converter of a second protection board and a second input connected to the voltage converter of the first protection board and an output connected to the internal supply of the first protection board. The first input is connected to the anode of a first diode, the cathode of the first diode being connected to the anode of a second diode, the cathode of the second diode being connected to the output. The second input is connected to the anode of a third diode, the cathode of the third diode being connected to the output.

The voltage converter of each protection board can be connected to the internal supply of at least one other protection board by way of a common backup supply bus.

The voltage converter of each protection board may be able to provide the internal supply of at least two protection boards.

The system may comprise an interconnection means able to provide the internal supply of a first protection board with the voltage provided by the voltage converter of a second protection board when the voltage provided by the voltage converter of the first protection board is absent, the interconnection means comprising the voltage converter of the first protection board linked at input to the power line and to the auxiliary supply line, the voltage converter being linked at output to a protection unit which is itself connected at output to a first diode by its anode, the cathode of the first diode being connected to the common backup supply bus, the anode of a second diode being connected between the output of the voltage converter and the input of the protection unit, the cathode of the second diode being connected to the internal supply of the first protection board, the interconnection means comprising an input connected to the common backup supply bus and linked to a first terminal of a breaker, the second terminal of the breaker being connected to the anode of a third diode, the cathode of the third diode being linked to the cathode of the second diode and to the internal supply of the first protection board.

Each connection between a voltage converter of a first protection board and the internal supply of another board may be protected at input by a fuse intended to isolate the voltage converter of the first board from the internal supply of a second board so as to limit the propagation of a fault of the voltage converter of the first board to the internal supply of the second board, and each connection also being protected at output by a protection unit so as to avoid propagation of a fault of the internal supply of the second board to the voltage converter of the first board.

A protection unit can be a discrete with limitation based on current or a fuse.

DESCRIPTION OF THE DRAWINGS

Other aims, characteristics and advantages of the invention will become apparent on reading the following description, given solely by way of nonlimiting example and with reference to the appended drawings in which.

DETAILED DESCRIPTION

Figure 1:
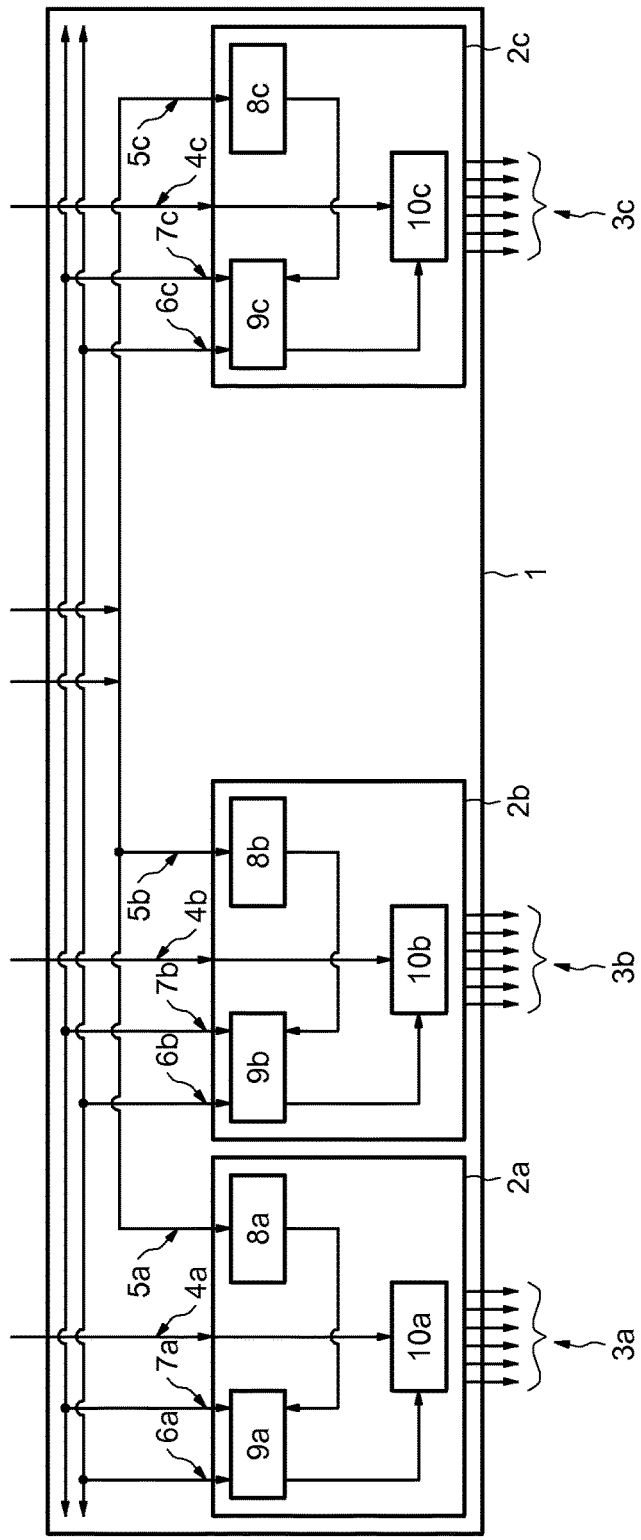
FIG. 1 illustrates the supply system for a rack equipped with protection boards.
Figure 2:
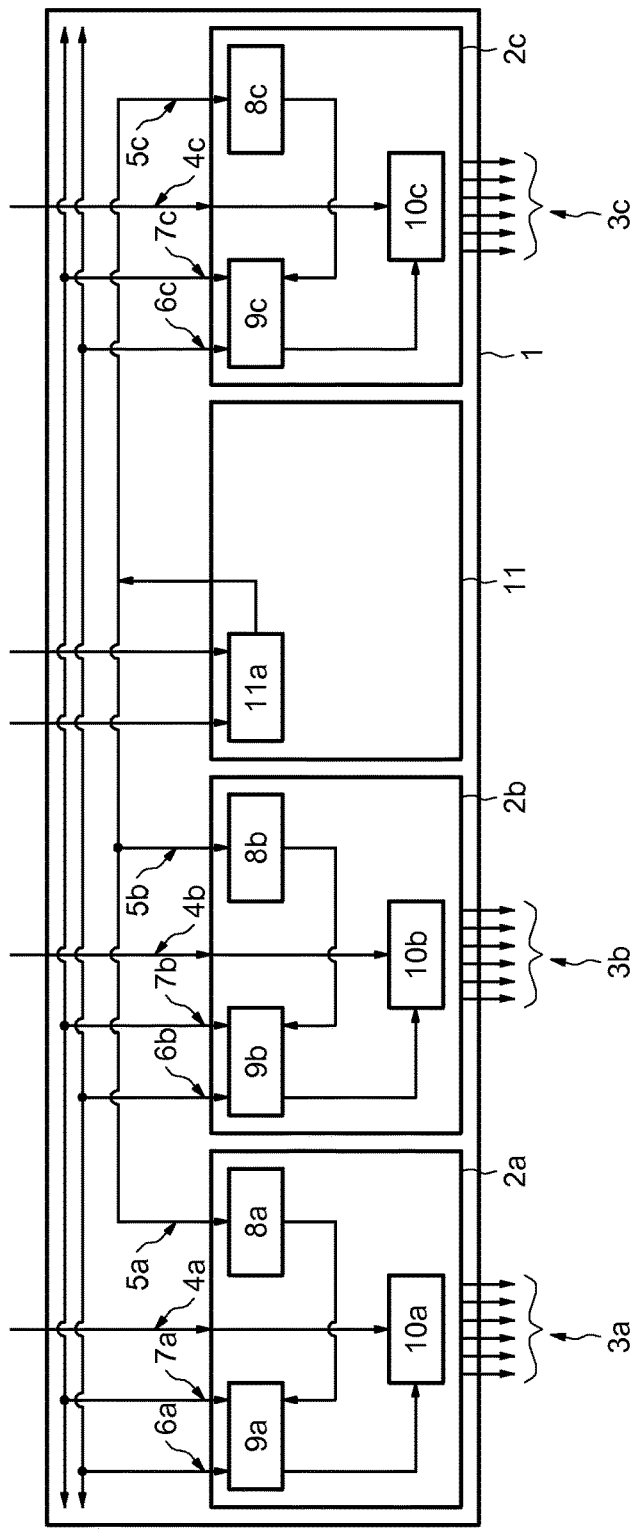
FIG. 2 illustrates another exemplary supply system for a rack equipped with protection boards comprising boards PS.
Figure 3:
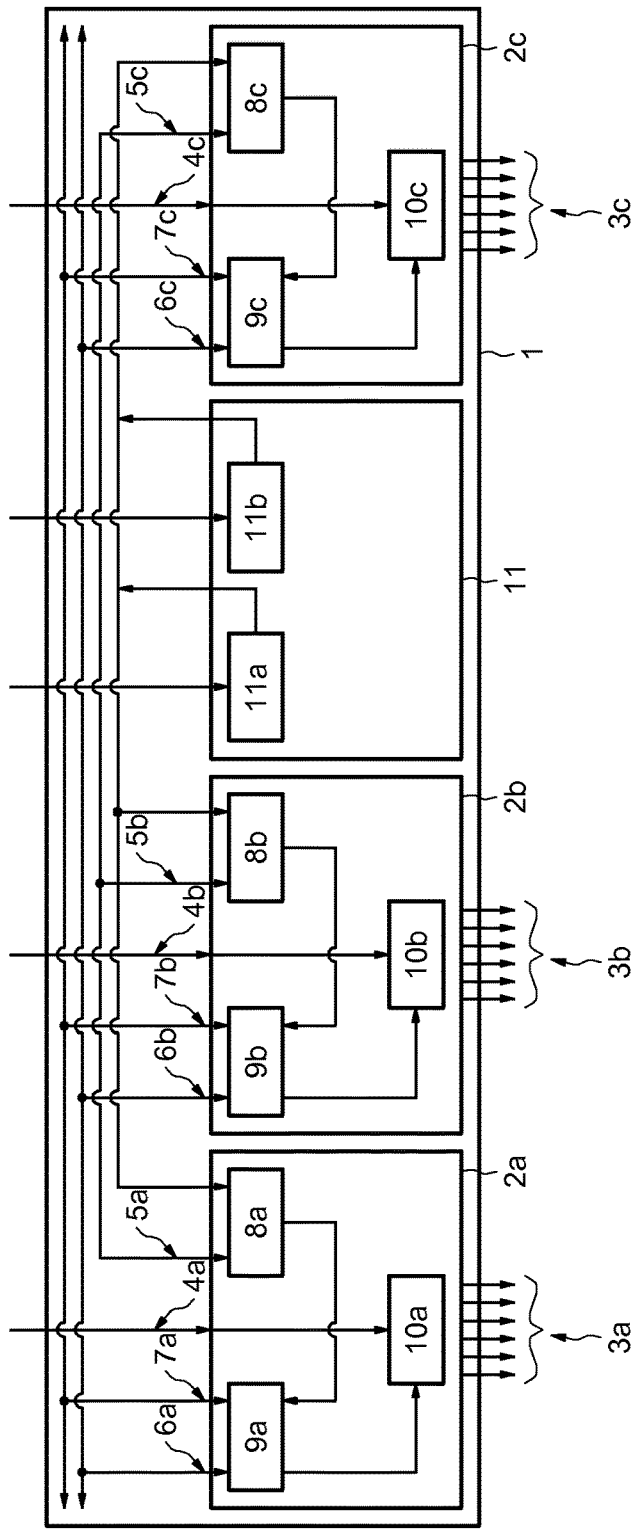
FIG. 3 illustrates another exemplary supply system for a rack equipped with protection boards with redundant supply board.
Figure 4:
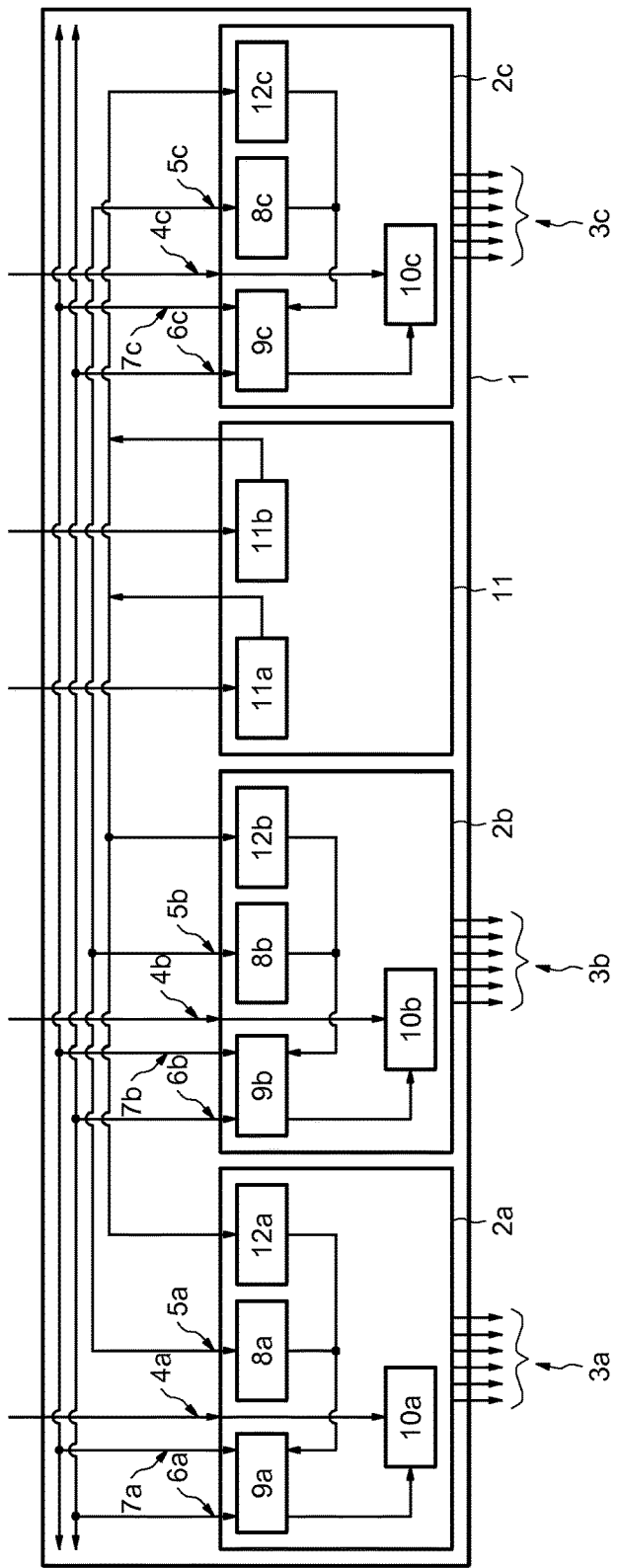
FIG. 4 illustrates another exemplary supply system for a rack equipped with protection boards with redundant supply and with redundant supply board.
Figure 5:
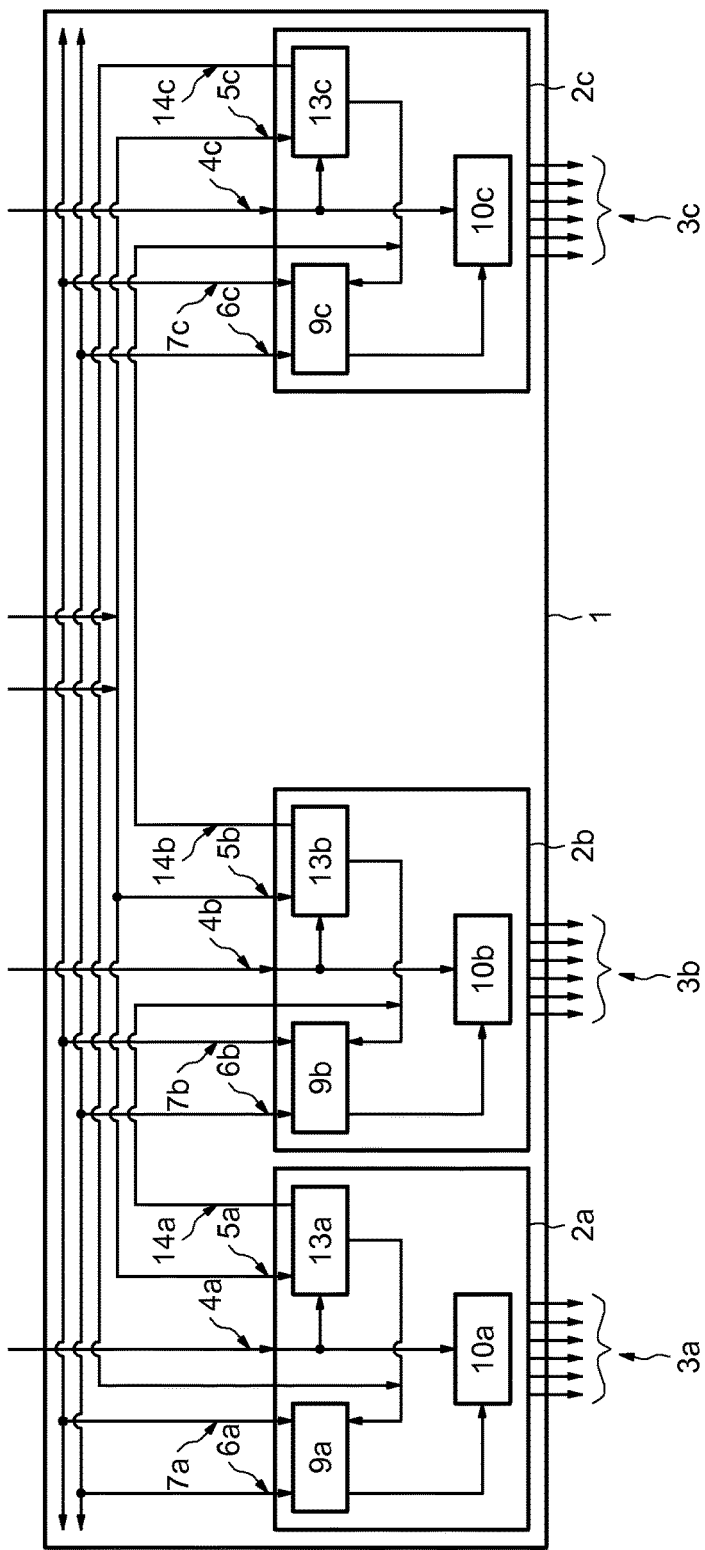
FIG. 5 illustrates a first embodiment of a supply system for electronic boards according to the invention.

FIG. 5 illustrates a first embodiment of a protection boards supply system in which the internal power supplies are strung together.

With respect to the previous examples, such a system is devoid of supply board 11.

It may be seen that this embodiment differs in addition from those described hereinabove on account of the fact that the voltage converter 13a, 13b and 13c specific to each protection board is connected to the auxiliary supply line in a similar manner to the internal supply of the protection boards in the previous examples, and to the power line 4a, 4b and 4c supplying the protected pathways.

The voltage converter 13a, 13b and 13c thus comprises similar DC/DC conversion functions to those of the DC/DC converters described hereinabove and also comprises a function for rectifying an AC voltage so as to be able to operate with two different supply voltages, including if they are of different nature (e.g.: 115 VAC power line, 28 VDC auxiliary line).

This solution makes it possible to have a stable supply in case of defect on the power line, for example a voltage null during a transfer, thereby avoiding a reinitialization of the protection boards and therefore the fastest possible return of the supply to the loads, or a short-circuit on a load entailing a plunge in the supply via the protection boards.

This solution also makes it possible to have a stable supply in case of operation of the aeroplane on the ground where all or some of the primary supplies are inactive. The protection boards may then be supplied by the auxiliary supply for maintenance operations.

This solution avoids having to make the auxiliary supply input 5a, 5b and 5c redundant since redundancy is already afforded by the power line 4a, 4b and 4c.

Moreover, the redundancy of the voltage converters 13a, 13b and 13c of the protection boards is ensured by stringing the boards together so that the DC/DC converter of a protection board supplies the adjacent protection board. The voltage converter 13a, 13b and 13c is then rated so as to supply two protection boards. In case of fault on the voltage converter 13a, 13b and 13c of a protection board, the adjacent protection board ensures continuity of supply.

This solution is more advantageous than twinning the voltage converters 13a, 13b and 13c on the protection boards, since a supply of double the power is always less bulky and above all less expensive than two supplies.

Figure 6:
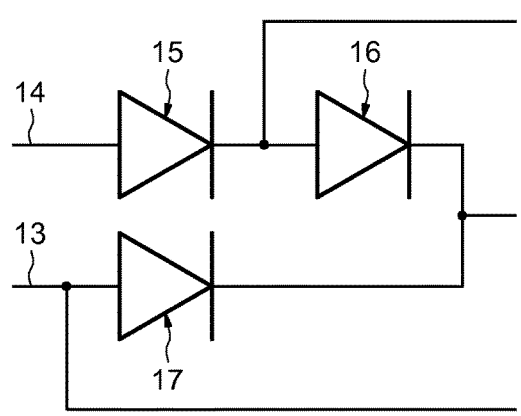
FIG. 6 illustrates a passive means of supply selection.

At the level of each protection board, the external supply input 14a, 14b, 14c originating from the adjacent board is placed in common with the internal supply originating from the voltage converter 13a, 13b and 13c in such a way that the internal supply has priority. FIG. 6 illustrates a passive means of supply selection comprising a first diode 15 linked by its anode to the external supply 14 and by its cathode to the anode of a second diode 16, the cathode of the second diode 16 being connected to the internal supply of the protection board. The passive means of supply selection moreover comprises a third diode 17 connected by its cathode to the internal supply of the protection board and by its anode to the voltage produced by the voltage converter 13. On account of the regulated nature of the supply voltages and on account of the voltage drop appearing across the terminals of a non-ideal diode, the external supply can only supply the protection board if the voltage produced by the DC/DC converter of this same board is absent.

A voltage measurement at the various points (12V internal, 12V external at the midpoint of the diodes, 12V) makes it possible to diagnose a supply fault or diode fault.

The external supply line 14 exported from one board to the other is protected (for example by fuse) so as to avoid a fault being propagated between the boards.

Such an embodiment presents the advantage of availability equivalent to the most complex solution according to the prior art with the cost of the simplest solution.

Figure 7:
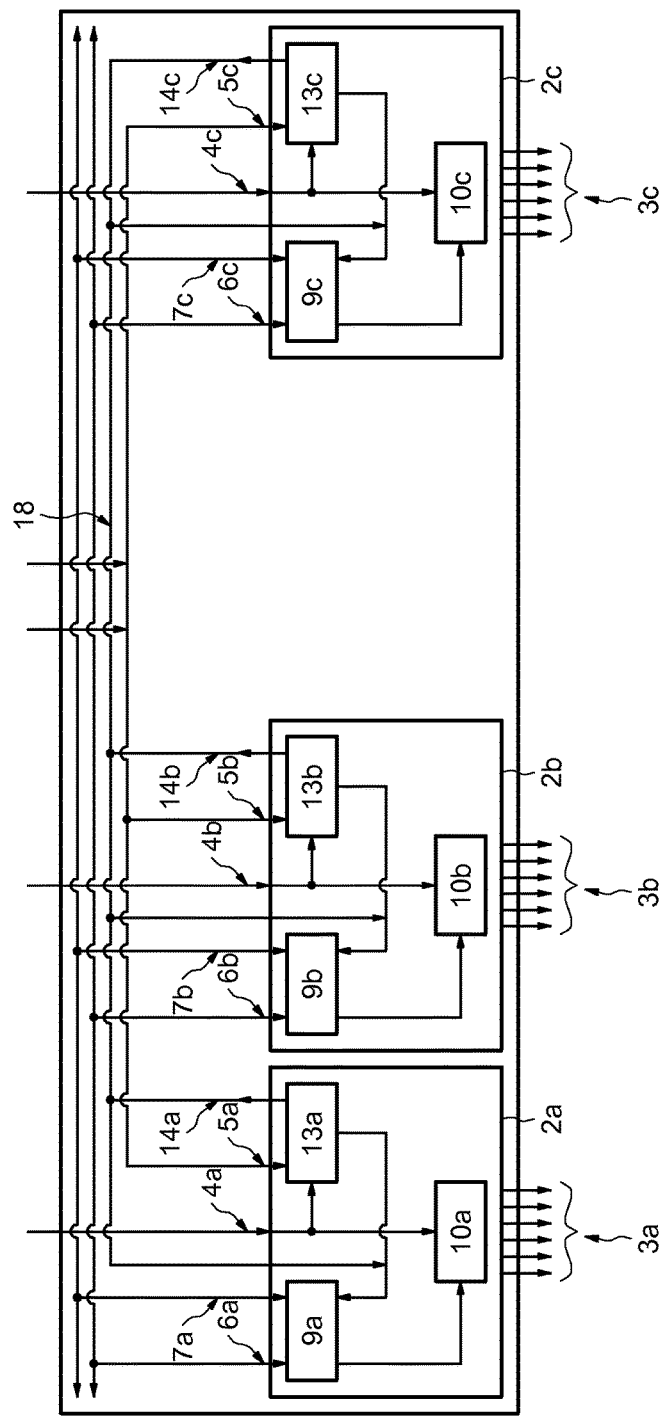
FIG. 7 illustrates a second embodiment of a supply system for electronic boards according to the invention.

FIG. 7 illustrates a second embodiment of a protection boards supply system in which the internal supplies are made redundant by way of a common backup supply bus 18.

The voltage converter 13a, 13b and 13c of each board is rated so as to provide a supply equivalent to that necessary for the supply of two protection boards. The output of the voltage converter 13a, 13b and 13c of each board is connected to a common backup supply bus 18. In case of supply fault of a board, the common backup supply bus 18 provides the supply to the faulty board.

With respect to the previous embodiment, it appears that the supply system for n protection boards can maintain all the boards under function if the DC/DC converters of n/2−1 protection boards suffer a fault.

Figure 8:
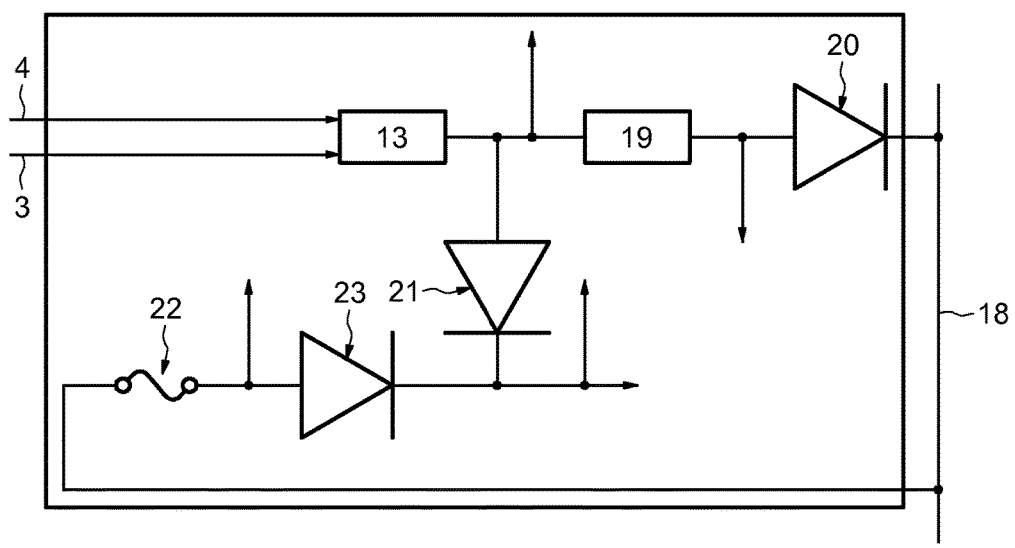
FIG. 8 illustrates a means of interconnection with a common backup supply bus.

FIG. 8 illustrates a means for interconnecting a protection board to the common backup supply bus 18 and to the supplies arising from the power line 4, of the auxiliary supply line 3.

The interconnection means comprises a voltage converter 13 linked, as in the case of the first embodiment, at input to the power line 4 and to the auxiliary supply line 3. The voltage converter 13 is linked at output to a protection unit 19, of protected or fused discrete output DSO type, itself connected at output to a first diode 20 by its anode, the first diode 20 being connected at output to the common backup supply bus 18 by way of its cathode.

Between the output of the voltage converter 13 and the input of the protection unit 19 is connected the anode of a second diode 21. The cathode of the second diode 21 is connected to the internal supply of the protection board.

Moreover, the interconnection means comprises an input connected to the common backup supply bus 18 and linked to a first terminal of a breaker 22, the second terminal of the breaker 22 being connected to the anode of a third diode 23. The cathode of the third diode 23 is linked to the cathode of the second diode 21 and to the internal supply of the protection board.

The interconnection means allows the common pooling of the supplies through diodes. The supply arising from the common backup supply bus is drawn by a board only if the internal voltage of the board has failed.

Moreover, each point of connection to the common backup supply bus 18 is protected. At input, a fuse is placed at the head and is intended to isolate the board from the bus in case of internal short-circuit and thus to avoid propagation of a fault from the board to the bus.

At output, the supply arising from the voltage converter 13 destined for the backup supply bus is protected by a discrete output (DSO) with limitation based on current. In case of current overshoot, the discrete output DSO cuts the line so as to avoid the propagation of the fault from the bus to the internal supply.

The various voltages are measured by the microprocessors of the board so as to diagnose any fault (fuse, diodes, converters). With this aim, various measurement points may be envisaged, in particular at the output of the voltage converter 13, between the anode of the second diode 21 and the protection unit 19, between the output of the protection unit 19 and the anode of the first diode 20, between the second terminal of the breaker 22 and the anode of the third diode 23, and downstream of the cathodes of the second and third diodes. These various measurement points make it possible to determine the failure of all or some of the components of the interconnection means.

It should be noted that this type of protection may be applied to the first embodiment.

The embodiment illustrated by FIGS. 7 and 8 presents the advantage of availability equivalent to the most complex solution with the cost of the simplest solution, among the solutions illustrated by FIGS. 1 to 4.

Moreover, the creation of a common point situated at the level of the backup bus has no effect on safety in view of the protection devices described at the level of the interconnection means.

As a variant, it is possible to create several backup supply buses within one and the same rack of protection boards so that a first part of the boards share a first backup bus, while a second part of the boards share a second backup bus. This makes it possible to avoid deploying a common point on the rack as a whole.

The embodiments of the invention in which an exclusive property or privilege is claimed are defined as follow:

1. Supply system for electronic boards of an electrical distribution system comprising at least two protection boards (2a, 2b) each able to supply power from a power line (4a, 4b) by way of separate protected pathways (3a, 3b), wherein each protection board (2a, 2b) comprises at least one voltage converter (13a, 13b) able to provide an internal supply voltage of the protection board on the basis of a supply voltage,
   wherein the voltage converter (13a) of a first protection board (2a) is connected to at least one second protection board (2b) so as to be able to provide the internal supply of the second protection board (2b) in case of failure of the voltage converter (13b) of the second protection board (2b),
   an interconnection means able to provide the internal supply of a first protection board (2a) with the voltage provided by the voltage converter (13b) of a second protection board (2b) when the voltage provided by the voltage converter (13a) of the first protection board (2a) is absent,
   the interconnection means comprising the voltage converter (13a) of the first protection board (2a) linked at input to the power line and to the auxiliary supply line,
   the voltage converter (13a) being linked at output to a protection unit (19) which is itself connected at output to a first diode (20) by its anode, the cathode of the first diode (20) being connected to the common backup supply bus (18),
   the anode of a second diode (21) being connected between the output of the voltage converter and the input of the protection unit (19), the cathode of the second diode (21) being connected to the internal supply of the first protection board (2a), and
   the interconnection means comprising an input connected to the common backup supply bus (18) and linked to a first terminal of a breaker (22), the second terminal of the breaker (22) being connected to the anode of a third diode (23), the cathode of the third diode (23) being linked to the cathode of the second diode (21) and to the internal supply of the first protection board (2a).

2. System according to claim 1, in which the voltage converter (13a, 13b) is able to be supplied by the power line (4a, 4b) and by an auxiliary supply line (5a, 5b) exhibiting different voltages.

3. System according to claim 1, comprising a passive means of supply selection able to provide the internal supply of a first protection board (2a) with the voltage provided by the voltage converter (13b) of a second protection board (2b)

when the voltage provided by the voltage converter (13a) of the first protection board (2a) is absent, and in which the passive means of supply selection comprises a first input connected to the voltage converter (13b) of a second protection board (2b) and a second input connected to the voltage converter (13a) of the first protection board (2a) and an output connected to the internal supply of the first protection board (2a);

the first input is connected to the anode of a first diode (15), the cathode of the first diode (15) being connected to the anode of a second diode (16), the cathode of the second diode (16) being connected to the output; and the second input is connected to the anode of a third diode (17), the cathode of the third diode (17) being connected to the output.

4. System according to claim 1, in which the voltage converter of each protection board is connected to the internal supply of at least one other protection board by way of a common backup supply bus (18).

5. System according to claim 4, in which the voltage converter of each protection board is able to provide the internal supply of at least two protection boards.

6. System according to claim 1, in which each connection between a voltage converter of a first protection board and the internal supply of another board is protected at input by a fuse intended to isolate the voltage converter of the first board from the internal supply of a second board so as to limit the propagation of a fault of the voltage converter of the first board to the internal supply of the second board, and each connection also being protected at output by a protection unit (19) so as to avoid propagation of a fault of the internal supply of the second board to the voltage converter of the first board.

7. System according to claim 6, in which a protection unit (19) is a discrete with limitation based on current or a fuse.

* * * * *